United States Patent [19]
Ueltzen

[11] Patent Number: 5,261,989
[45] Date of Patent: Nov. 16, 1993

[54] STRADDLE MOUNTING AN ELECTRICAL CONDUCTOR TO A PRINTED CIRCUIT BOARD

[75] Inventor: Kenneth M. Ueltzen, Rocklin, Calif.

[73] Assignee: Intel Corporation, Santa Clara, Calif.

[21] Appl. No.: 823,873

[22] Filed: Jan. 22, 1992

[51] Int. Cl.⁵ .............................................. B32B 31/00
[52] U.S. Cl. ................................... 156/252; 156/497; 29/592.1; 29/830; 29/840; 29/862; 228/180.1; 228/180.22; 439/62; 439/83; 439/84; 439/91
[58] Field of Search ............... 156/252, 497; 29/592.1, 29/830, 840, 885, 862; 439/62, 83, 84, 91; 228/180.1, 180.2

[56] References Cited

U.S. PATENT DOCUMENTS

| | | | |
|---|---|---|---|
| 4,179,322 | 12/1970 | Brown et al. | 29/885 |
| 4,515,304 | 5/1985 | Berger | 228/180.2 |
| 4,581,301 | 4/1986 | Michaelson | 427/97 |
| 4,761,881 | 8/1988 | Bora et al. | 228/180.1 |
| 4,773,955 | 9/1988 | Mabuchi et al. | 156/257 |
| 4,774,760 | 10/1988 | Seaman et al. | 29/840 |
| 4,875,863 | 10/1989 | Reed | 439/79 |
| 4,935,584 | 6/1990 | Boggs | 29/830 |
| 4,997,517 | 3/1981 | Parthasarathi | 29/827 |
| 4,998,342 | 3/1991 | Bonnell et al. | 29/840 |
| 5,019,944 | 5/1991 | Ishii et al. | 439/91 |

Primary Examiner—Patrick J. Ryan
Assistant Examiner—Merrick Dixon
Attorney, Agent, or Firm—Blakely, Sokoloff, Taylor & Zafman

[57] ABSTRACT

A method and apparatus for bonding electrical conducting means having a body, a first lead, and a second lead to a printed circuit board having a first side and a second side. A first surface mount pad is formed on the first side of the printed circuit board. A reservoir pad is formed on the first side of the printed circuit board. A second surface mount pad is formed on the second side of the printed circuit board. A via hole is formed in the printed circuit board. The via hole runs from the first side to the second side of the printed circuit board. The via hole abuts the reservoir pad and the second surface mount pad. Bonding means is deposited onto the first surface mount pad and the reservoir pad and into the via hole but not onto the second surface mount pad. The first lead of the electrical conducting means is placed against the bonding means deposited on the first surface mount pad and the second lead of the electrical conducting means is placed below the second surface mount pad. The bonding means is heated. The bonding means is cooled.

5 Claims, 2 Drawing Sheets

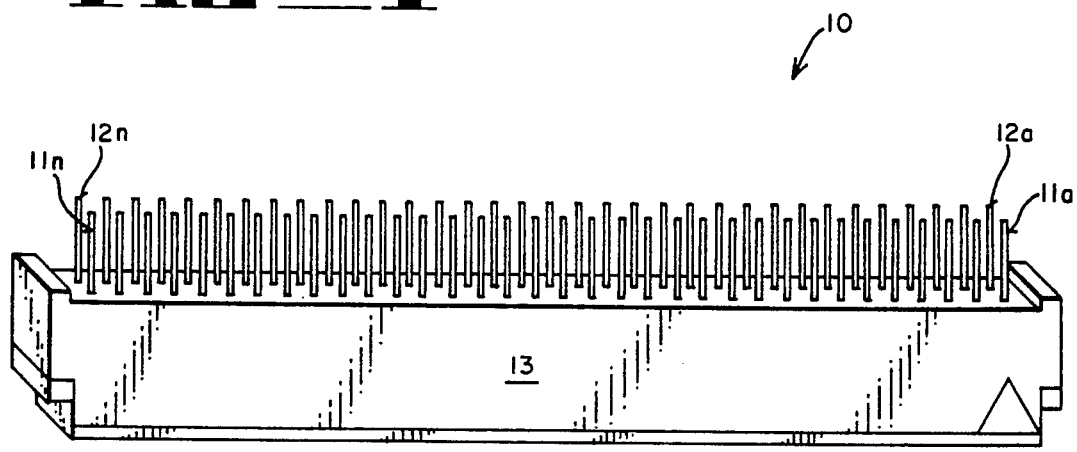
FIG_1
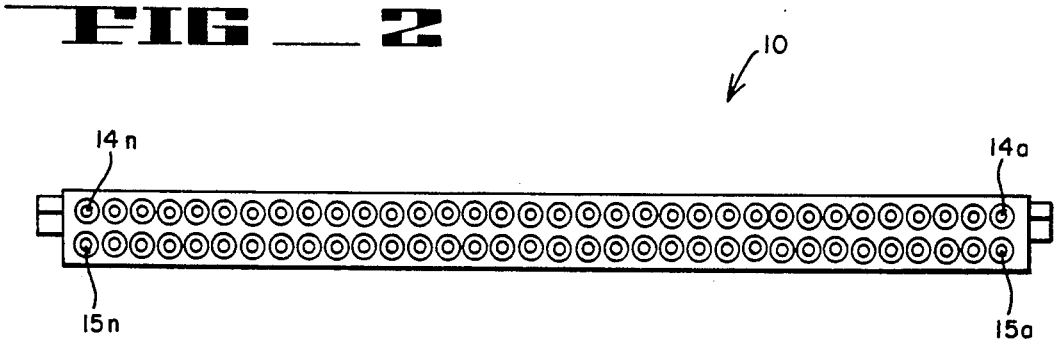
FIG_2
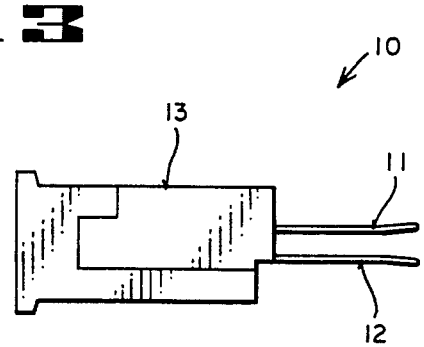
FIG_3

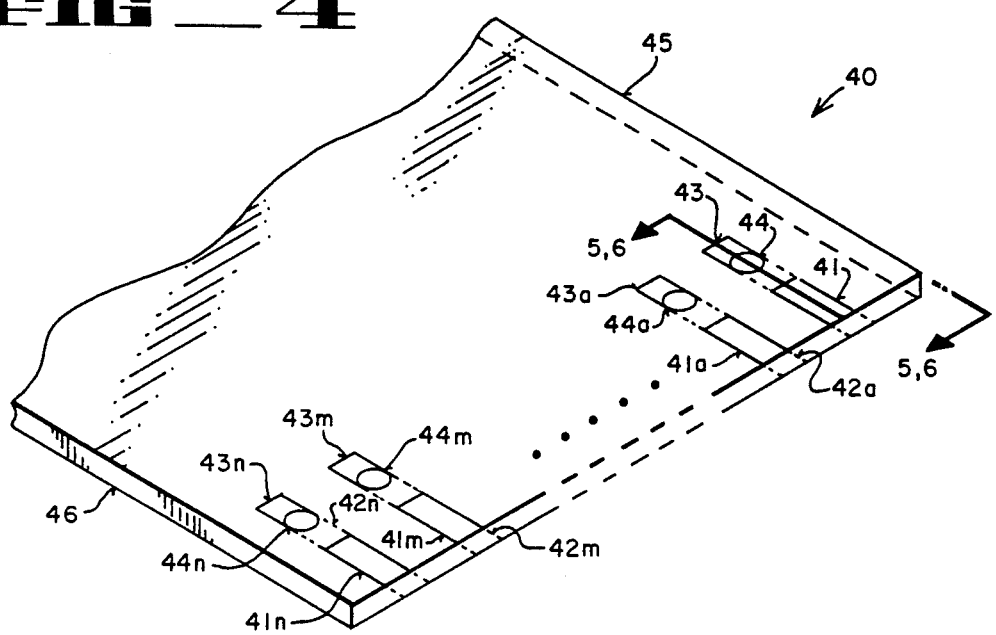
FIG_4
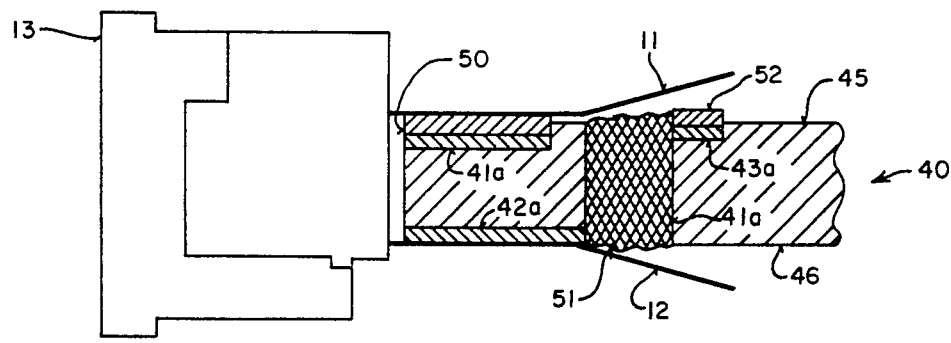
FIG_5
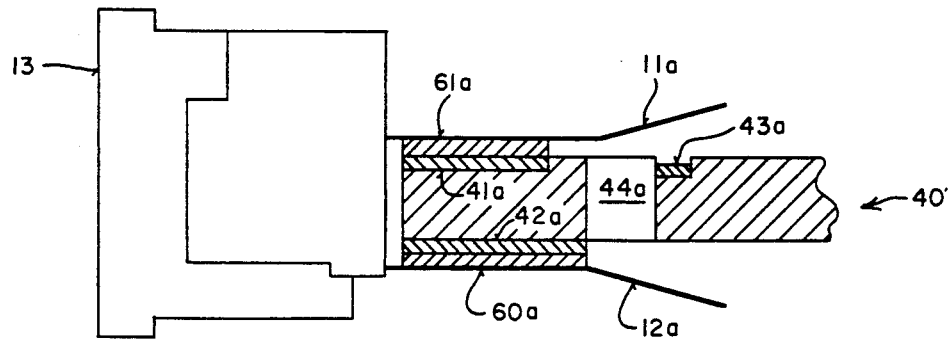
FIG_6

STRADDLE MOUNTING AN ELECTRICAL CONDUCTOR TO A PRINTED CIRCUIT BOARD

FIELD OF THE INVENTION

The present invention pertains to the field of the attachment of electrical conductors and components to printed circuit boards. More particularly, this invention relates to a method and apparatus with respect to straddle-mounted attachment of an electrical conductor to a printed circuit board.

BACKGROUND OF THE INVENTION

One type of prior electrical assembly includes a printed circuit board ("PCB") on which electrical connectors and devices are mounted. The electrical connectors and devices are typically assembled on one side of the printed circuit board by a prior surface mounting process. The electrical connectors are typically used to connect the PCB to other electrical components or PCBs.

A typical prior art surface mounting process for a PCB assembly includes the following three steps: a solder screen printing step, a component placement step, and a solder reflow step.

During the solder screen printing step (also referred to as a solder screening operation), a controlled volume of solder paste is deposited onto surface mount pads arranged in a land pattern on the PCB. The solder deposition is accomplished by drawing solder paste over a metallic stencil (or screen) with openings for the surface mount pads on the PCB. The solder paste is pushed through the openings of the stencil with a squeegee. After solder deposition is complete, the stencil is raised and removed from the PCB, leaving a print of solder paste on the surface mount pads of the PCB.

An electrical connector, for example, is then placed on top of the printed solder paste. This placement is typically done by dedicated surface mount placement equipment, by customized robotic arms, or by hand. The leads of the connector must be accurately aligned with the print of solder paste and with the surface mount pads.

Once the electrical connector has been properly placed, the solder reflow step (also referred to as the solder reflow operation) is initiated. The populated PCB passes through a series of heated areas, wherein the temperature of the solder paste is carefully elevated. Once the temperature reaches the melting temperature of the solder paste and the solder becomes liquified, the connector bonds to the PCB after cooling.

Typically the prior art surface mounting process is used for electrical connectors, components, and devices.

The technological push for smaller, lighter, and thinner PCB assemblies has led to the creation of a new family of connectors. The new connectors are referred to as straddle-mount connectors. A straddle-mount connector typically mounts on an edge of a PCB and electrically connects to both sides of the PCB.

One disadvantage of the prior surface mounting process is that the mounting of a straddle-mount connector onto the PCB typically requires the connector to be hand soldered to the PCB or requires the use of laser equipment to make the connection. This is because the solder screen printing operation of the surface mounting process is typically only performed on one side of the printed circuit board at a time. Given that the straddle-mount connector must be mounted on both sides of the PCB in one surface mounting process, the solder screen printing operation poses difficulties with respect to the use of the straddle-mount connectors.

Furthermore, given that the stencil must be flush with the surface of the PCB, connectors are precluded from being presented onto the surface of the printed circuit board during the solder screen printing operation.

SUMMARY AND OBJECTS OF THE INVENTION

One of the objects of the present invention is to provide a method and apparatus with respect for straddle mounting an electrical means onto both sides of a printed circuit board using one solder screening operation.

A method is provided for bonding electrical conducting means having a body, a first lead, and a second lead to a printed circuit board having a first side and a second side. A first surface mount pad is formed on the first side of the printed circuit board. A reservoir pad is formed on the first side of the printed circuit board. A second surface mount pad is formed on the second side of the printed circuit board. A via hole is formed in the printed circuit board. The via hole runs from the first side to the second side of the printed circuit board. The via hole abuts the reservoir pad and the second surface mount pad. Bonding means is deposited onto the fist surface mount pad and the reservoir pad and into the via hole but not onto the second surface mount pad. The first lead of the electrical conducting means is placed against the bonding means deposited on the first surface mount pad and the second lead of the electrical conducting means is placed below the second surface mount pad. The bonding means is heated such that (1) the bonding means of the first surface mount pad is liquid and contacts the first lead of the electrical conducting means and the first surface mount pad, (2) the bonding means on the reservoir pad is liquid, flows into the via hole, flows out of the via hole and onto the second surface mount pad, and contacts the second lead of the electrical conducting means and the second surface mount pad, and (3) the bonding means in the via hole is liquid, flows out of the via hole and onto the second surface mount pad, and contacts the second lead of the electrical conducting means and the second surface mount pad. The bonding means is cooled such that the bonding means bonds the first lead of the electrical conducting means to the first surface mount pad and bonds the second lead of the electrical conducting means to the second surface mount pad.

An electrical apparatus is also described which includes electrical conducting means comprising a body, a first lead, and a second lead, and a printed circuit board having a first side and a second side. The printed circuit board includes a fist surface mount pad on the first side, a reservoir pad on the first side, a second surface mount pad on the second side, and ,a via hole from the first side to the second side. The via hole abuts the reservoir pad and the second surface mount pad. Bonding means is provided for bonding the first lead of the electrical conducting means to the first surface mount pad on the first side of the printed circuit board and for bonding the second lead of the electrical conducting means to the second surface mount pad on the second side of the printed circuit board. The bonding means liquifies and flows above a first temperature.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a perspective view of a straddle-mount connector;

FIG. 2 is a front view of the straddle-mount connector;

FIG. 3 is a side view of the straddle-mount connector;

FIG. 4 is a perspective view showing a portion of a printed circuit board, including surface mount pads, via holes, and solder reservoirs;

FIG. 5 is a cross sectional view along the section line 5—5 of FIG. 4 of the straddle-mount connector and the printed circuit board and illustrates the solder deposition prior to a solder reflow operation;

FIG. 6 is a cross sectional view along the section line 6—6 of FIG. 4 of the straddle-mount connector and the printed circuit board and illustrates solder deposition after a solder reflow operation is complete.

DETAILED DESCRIPTION

FIGS. 1 through 3 show a straddle-mount connector 10 that can be straddle mounted to edges of a printed circuit board. In FIGS. 1 through 3, straddle-mount connector 10 includes a coupling bar 13, a plurality of top leads 11a–11n and bottom leads 12a–12n. The number of the top leads 11a–11n equals the number of the bottom leads 12a–12n. Top leads 11a through 11n are collectively referred to as leads 11. Bottom leads 12a through 12n are collectively referred to as leads 12. Top leads 11a through 11n are coupled to an upper part of coupling bar 13. Bottom leads 12a through 12n are coupled to a lower part of coupling bar 13.

FIG. 1 shows thirty-four top leads 11a–11n and thirty-four bottom leads 12a–12n. In other embodiments of the present invention, there are more or fewer top leads 11a–11n and more or fewer bottom leads 12a–12n. FIG. 3 shows the top leads 11 and the bottom leads 12 of connector 10.

Top leads 11 are mounted on an upper edge of a printed circuit board (not shown in FIGS. 1–3) such that top leads 11 make electrical contact with the upper edge of the printed circuit board. Bottom leads 12 are mounted on a lower edge of the printed circuit board such that bottom leads 12 make electrical contact with the lower edge of the printed circuit board.

As shown in FIG. 3, top leads 11 and bottom leads 12 have outwardly protruding end portions. The protruding end portions of the top and bottom leads 11 and 12 facilitate the sliding of connector 10 onto an edge of the printed circuit board. In one embodiment, top leads 11 and bottom leads 12 are of the same length. In another embodiment, the top leads are shorter than the bottom leads.

As shown in FIG. 2, connector 10 also includes a plurality of top coupling holes 14a through 14n and bottom coupling holes 15a through 15n. Top coupling holes 14a through 14n and bottom coupling holes 15a through 15n are collectively referred to as top coupling holes 14 and bottom coupling holes 15. Top coupling holes 14 and bottom coupling holes 15 reside on a side of coupling bar 13 opposite to side containing top and bottom leads 11 and 12.

The top and bottom coupling holes 14 and 15 permit connector 10 to connect to other printed circuit boards, electrical components, or wires. The number of the top coupling holes 14a–14n is equal to the number of the bottom coupling holes 15a–15n.

In an alternative embodiment, coupling bar 13 contains an electrical component, such as diode. In another alternative embodiment, coupling bar 13 contains an integrated circuit.

In other alternative embodiments, electrical components, rather than connectors, are straddle mounted onto printed circuit boards. In one alternative embodiment, a diode is straddle mounted onto a PCB. For another alternative embodiment, an integrated circuit ("IC") is straddle mounted onto a PCB. For other alternative embodiments, an electrical component that has a top lead and a bottom lead is straddle mounted onto a PCB.

FIG. 4 is a perspective view showing a portion of PCB 40 that attaches to straddle-mount connector 10. PCB 40 has a top surface 45 and a bottom surface 46. Connector 10 is straddle mounted over surfaces 45 and 46 of PCB 40.

As shown in FIG. 4, PCB 40 has a number of surface mount pads 41a through 41n on the top surface 45 and a number of surface mount pads 42a through 42n on the bottom surface 46. Surface mount pads 41a through 41n are collectively referred to as surface mount pads 41. Surface mount pads 42a through 42n are collectively referred to as surface mount pads 42. Surface mount pads 41a–41n and 42a–42n are part of a land pattern for mounting components on PCB 40. The number of surface mount pads 41a–41n on the top surface 45 is equal to the number of the top leads 11 of connector 10. The number of surface mount pads 42a–42n on the bottom surface 46 is equal to the number of the bottom leads 12 of connector 10.

Surface mount pads 41a–41n and 42a–42n are metalized areas on PCB 40. Surface mount pads 41a–41n and 42a–42n can conduct electricity. Conventional processes are used to make surface mount pads 41a–41n and 42a–42n.

Connector 10 is straddle mounted on PCB 40. Each of the top leads 11a through 11n of connector 10 is bonded onto a respective one of the surface mount pads 41a through 41n. Each of the bottom leads 12a through 12n of connector 10 is bonded onto a respective one of the surface mount pads 42a through 42n. The bonding is done by surface mounting process described in more detail below.

Each of the bonded top leads 11a through 11n makes electrical contact with a respective one of the surface mount pads 41a through 41n. Each of the bonded bottom leads 12a through 12n of connector 10 makes electrical contact with a respective one of the surface mount pads 42a through 42n.

PCB 40 also includes a number of via holes 44a through 44n between top surface 45 and bottom surface 46 of PCB 40. Each of surface mount pads 42a–42n on the bottom surface 46 abuts a respective one of via holes 44a–44n on the bottom surface 46. Thus, the number of via holes 44a–44n is equal to the number of surface mount pads 42a–42n. None of surface mount pads 41a–41n, however, abut via holes 44a–44n on the top surface 45.

Conventional processes are employed to make via holes 44a–44n. For one embodiment, the walls of via holes 44a–44n are each coated with a layer of metal. In another embodiment, the walls of via holes 44a–44n are not each coated with metal layer.

Via holes 44a–44n receive and store solder paste so that solder joints are formed at surface mount pads 42a–42n on bottom surface 46. Via holes 44a–44n are described in more detail below.

PCB 40 further includes a number of solder reservoirs 43a through 43n on top surface 45 only. Each of the solder reservoirs 43a–42n abuts a respective one of via holes 44a through 44n. Solder reservoirs 43a–43n are metalized areas on the top surface 45.

Solder reservoirs 43a–43n receive solder paste during a solder screening operation. Solder reservoirs 43a–43n store additional solder paste for forming—by way of via holes 44a–44n—solder joints at surface mount pads 42a–42n on the bottom surface 46.

For an alternative embodiment, PCB 40 does not include solder reservoirs 43a–43n. Solder reservoirs 43a–43n are described in more detail below.

As mentioned above, connector 10 of FIGS. 1–3 is bonded to PCB 40 of FIG. 4 by a surface mounting process. The surface mounting process includes solder screening, component placing, and solder reflow operations.

Before connector 10 is mounted onto PCB 40, a solder screening is performed to deposit a controlled volume of solder paste onto surface mount pads 41a–41n. The solder screening operation is performed by first placing a metallic stencil (not shown) over the portion of PCB 40 containing metallic pads 41a–41n. The metallic stencil has openings for surface mount pads 41a–41n. The stencil is placed flush with respect to top surface 45 of PCB 40. The openings in the stencil are precisely aligned with respect to surface mount pads 41a–41n. Solder paste is pushed through the openings of the stencil with a squeegee. After the solder deposition is complete, the stencil is raised, leaving a layer (i.e., a print) of solder paste on each of the surface mount pads 41a–41n of PCB 40. Thus, solder paste layer 50a–50n are left on the top of respective surface mount pads 41a–41n. FIG. 5 shows solder paste layer 50a deposited on surface mount pad 41a.

The metallic stencil also has openings for via holes 44a–41n and solder reservoirs 43a–43n. During the solder screening operation mentioned above, solder paste is pushed through the opening of the stencil with a squeegee. This also deposits solder paste onto solder reservoirs 43a–43n and into via holes 44a–44n. Solder paste layers 52a–52n are deposited on respective solder reservoirs 43a–43n. Solder paste deposits 51a–51n are left in respective via holes 44a–44n. Because of surface tension, the solder paste in via holes 44a–44n flows slowly towards bottom surface 46 of PCB 40. Nevertheless, the solder paste eventually substantially fills via holes 44a–44n.

FIG. 5 shows solder paste layer 52a deposited on solder reservoir 43a. FIG. 5 also shows via hole 41a filled with solder paste 51a.

After the solder screening operation is complete, sides 45 and 46 of PCB 40 are inserted between top leads 11 and bottom leads 12 of connector 10, as shown in FIG. 5. Top leads 11a–11n are aligned over respective (1) solder paste layers 50a–50n of surface mount pads 41a–41n, (2) solder paste layers 52a–52n of solder reservoirs 43a–43n, and (3) solder paste deposits 51a–51n of via holes 44a–44n. Bottom leads 12a–12n are aligned below surface mount pads 42a–42n and solder deposits 51a–51n of via holes 44a–44n. FIG. 5 is a cross-section that shows lead 11a above solder paste layer 50a, solder paste deposit 51a, and solder paste layer 52a. FIG. 5 also shows lead 12a below surface mount pad 42a and solder paste deposit 51a of via hole 44a.

When PCB 40 is inserted between top leads 11 and bottom leads 12 of connector 10, each of top leads 11a–11n contacts its respective one of solder paste layers 50a–50n and each of bottom leads 12a–12n contacts its respective one of surface mount pads 42a–42n. As can be seen from FIG. 5, top lead 11 contacts solder paste layer 50a and bottom lead 12a contacts surface mount pad 42a.

For one embodiment, dedicated surface mount equipment inserts PCB 40 between leads 11 and 12 of connector 10. For other embodiments, dedicated tools or customized robotic arms insert PCB 40 between leads 11 and 12. For another embodiment, insertion of PCB 40 between leads 11 and 12 is done by hand.

For the alternative embodiment in which each of the top leads 11 of connector 10 is shorter than each of the bottom leads 12, the top leads 11a–11n do not extend far enough to reside above respective solder paste deposits 51a–51n and solder paste layers 52a–52n.

Via holes 44a through 44n act as a vehicle for storing and passing the solder to surface mount pads 42a through 42n on bottom surface 46. Only one solder screening operation is performed with respect to PCB 40, and there is no separate step of applying a layer of solder paste to surface mount pads 42a–42n. Instead, surface mount pads 42a–42n receive solder from deposits 51a–51n of via holes 44a–44n.

FIG. 5 illustrates the coupling of connector 10 to PCB 40 after the solder screening and component placement operations, but prior to the solder reflow operation.

FIG. 5 shows solder layers and deposits 50a, 51a, and 52a. Solder layers and deposits 50b–50n, 51b–51n, and 52b–52n are not shown in FIG. 5, but those layers and deposits are similar to respective solder layers and deposits 50a, 51a, and 52a.

Once connector 10 has been properly positioned with respect to PCB 40, a solder reflow operation is performed as part of the surface mounting process. The solder reflow operation is used to bond leads 11a–11n of connector 10 onto respective surface mount pads 41a–41n with the solder from respective solder paste layers 50a–50n. The solder reflow operation is also used to bond bottom leads 12a–12n to surface mount pads 42a–42n using solder from (1) solder deposits 51a–51n from via holes 44a–44n and (2) solder layers 52a–52n from solder reservoirs 43a–43n.

For the alternative embodiment in which PCB 40 does not include solder reservoirs 43a–43n, bottom leads 12a–12n of connector 10 are bonded to surface mount pads 42a–42n by using the solder stored as solder deposits 51a–51n in via holes 44a–44n.

As part of the solder reflow operation, PCB 40 is passed through a series of heated areas, each physical area is the series of areas having a higher temperature. This technique elevates the temperature of the solder paste layers 50a–50n, solder paste deposits 51a–51n, and solder paste layers 52a–52n. When the temperature reaches the melting point of solder, the solder paste at layers 50a-50n and 52a-52n and deposits 51a-51n becomes liquified. The solder paste in layers 50a-50n on top of respective surface mount pads 41a-41n then forms solder joints 61a-61n between respective top leads 11a-11n of connector 10 and respective surface mount pads 41a-41n.

FIG. 6 shows solder joint 61a. Solder joints 61b-61n, which are not shown in FIG. 6, are similar to solder joint 61a.

When the temperature reaches the melting point of solder, then the solder deposits 51a-51n in via holes 44a-44n also liquify. The liquified solder from solder deposits 51a-51n feels the force of gravity and slowly flows out of via holes 44a-44n and towards bottom surface 46. The gravitational force acting on liquified solder deposits 51a-51n overcomes the surface tension of solder joints that are being formed with respect to bottom leads 12a-12n of connector 10.

Given that surface mount pads 42a-42n via holes 44a-44n, the solder deposits 51a-51n from respective via holes 44a-44n flows onto respective surface mount pads 42a-42n to form solder joints 60a-60n between respective surface mount pads 42a-42n and respective bottom leads 12a-12n of connector 10.

FIG. 6 shows solder joint 60a. Solder joints 60b-60n, which are not shown in FIG. 6, are similar to joint 60a.

During the solder reflow operation, the solder paste stored as solder layers 52a-52n on respective solder reservoirs 43a-43n provides additional solder paste for respective solder joints 60a-60n. The solder paste stored as solder layers 52a-52n also becomes liquified during the solder reflow operation and flows onto surface mount pads 42a-42n by way of via holes 44a-44n. For example, solder joint 60a shown in FIG. 6 also includes some solder that had previously resided in solder layer 52a over solder reservoir 43a.

After the solder reflow operation, PCB 40 and connector 10 are cooled. This causes the liquid solder joints 60a-60n and 61a-61n to solidify. This causes leads 11a-11n and 12a-12n to bond to respective surface mount pads 41a-41n and 42a-42n.

FIG. 6 shows connector 10 and PCB 40 in cross section after completion of the surface mounting process. As a result of the surface mounting process, connector 10 is in a straddle mount relationship with PCB 40. Solder joint 61a bonds top lead 11a of connector 10 to surface mount pad 41a. Solder joint 60a bonds bottom lead 12a of connector 10 to surface mount pad 42a. Via hole 44a is a substantially empty cavity no longer filled with solder deposit 51a. Solder reservoir 43a stores substantially no solder paste and is no longer covered with solder layer 52a. As discussed above, the solder in solder deposit 51a and solder layer 52a has flowed downward through via hole 44a to form solder joint 60a. In short, FIG. 6 shows a cross section of connector 10 that is straddle-mounted to printed circuit board 40.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for straddle bonding electrical conducting means having a body, a first lead, and a second lead to a printed circuit board having a first side and a second side, wherein the first side is opposite to the second side, wherein the first lead is to be surface bonded on the first side of the printed circuit board and the second lead is to be surface bonded on the second side of the printed circuit board, wherein the first and second leads are attached to the body such that the electrical conducting means is an integral member, wherein the method comprises the steps of:

(A) forming a first surface mount pad on the first side of the printed circuit board;

(B) forming a reservoir pad on the first side of the printed circuit board;

(C) forming a second surface mount pad on the second side of the printed circuit board;

(D) forming a via hole in the printed circuit board, wherein the via hole runs from the first side to the second side of the printed circuit board, and wherein the via hole abuts the reservoir pad on the first side of the printed circuit board and the second surface mount pad on the second side of the printed circuit board;

(E) depositing bonding means onto the first surface mount pad and the reservoir pad and into the via hole but not onto the second surface mount pad, wherein the step (E) is performed only from the first side of the printed circuit board, wherein the step (E) is not performed from the second side of the printed circuit board, wherein the via hole and the reservoir pad hold the bonding means to be delivered to the second surface mount pad, wherein the via hole acts as a pathway to deliver the bonding means stored in the reservoir pad and the via hole to the second surface mount pad when the bonding means is heated;

(F) placing the first lead of the electrical conducting means against the bonding means deposited on the first surface mount pad and placing the second lead of the electrical conducting means below the second surface mount pad;

(G) heating the bonding means such that (1) the bonding means on the first surface mount pad is liquid and contacts the first lead of the electrical conducting means and the first surface mount pad, (2) the bonding means on the reservoir pad is liquid, flows into the via hole, flows out of the via hole and onto the second surface mount pad, and contacts the second lead of the electrical conducting means and the second surface mount pad, and (3) the bonding means in the via hole is liquid, flows out of the via hole and onto the second surface mount pad, and contacts the second lead of the electrical conducting means and the second surface mount pad, wherein the bonding means contacts the second lead of the electrical conducting means and the second surface mount pad on the second side of the printed circuit board without being deposited onto the second surface mount pad, wherein the bonding means on the reservoir pad and in the via hole is heated to be liquid and flows onto the second surface mount pad to contact the second lead of the electrical conducting means when the bonding means on the first surface mount pad is heated to be liquid and contacts the first lead of the electrical conducting means;

(H) cooling the bonding means such that the bonding means bonds the first lead of the electrical conducting means to the first surface mount pad and bonds the second lead of the electrical conducting means to the second surface mount pad.

2. The method of claim 1 for bonding the electrical conducting means to the printed circuit board, wherein the step of depositing means comprises depositing the bonding means through a stencil.

3. The method of claim 1 for bonding the electrical conducting means to the printed circuit board, wherein the bonding means comprises solder.

4. The method of claim 1 for bonding the electrical conducting means to the printed circuit board, wherein the electrical conducting means comprises an electrical connector.

5. The method of claim 1 for bonding the electrical conducting means to the printed circuit board, wherein the first side of the printed circuit board is a top of the printed circuit board and the second side of the printed circuit board is a bottom of the printed circuit board.

* * * * *

UNITED STATES PATENT AND TRADEMARK OFFICE
CERTIFICATE OF CORRECTION

PATENT NO. : 5,261,989
DATED : November 16, 1993
INVENTOR(S) : Kenneth M. Ueltzen It is certified that error appears in the above-indentified patent and that said Letters Patent is hereby corrected as shown below:

Column 5. line 14: Delete "42n"  Insert in place thereof --43n--
Column 5, line 49: Delete "41n"  Insert in place thereof --44n-

Signed and Sealed this

Nineteenth Day of September, 1995

Attest:

BRUCE LEHMAN

Attesting Officer

Commissioner of Patents and Trademarks